United States Patent
Nojima

(10) Patent No.: US 7,895,541 B2
(45) Date of Patent: Feb. 22, 2011

(54) SEMICONDUCTOR INTEGRATED CIRCUIT PATTERN VERIFICATION METHOD, PHOTOMASK MANUFACTURING METHOD, SEMICONDUCTOR INTEGRATED CIRCUIT DEVICE MANUFACTURING METHOD, AND PROGRAM FOR IMPLEMENTING SEMICONDUCTOR INTEGRATED CIRCUIT PATTERN VERIFICATION METHOD

(75) Inventor: Shigeki Nojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 662 days.

(21) Appl. No.: 11/901,030

(22) Filed: Sep. 14, 2007

(65) Prior Publication Data
US 2008/0022244 A1 Jan. 24, 2008

Related U.S. Application Data

(62) Division of application No. 11/176,181, filed on Jul. 8, 2005, now Pat. No. 7,278,125.

(30) Foreign Application Priority Data

Jul. 9, 2004 (JP) ............................. 2004-203439

(51) Int. Cl.
    *G06F 17/50* (2006.01)
(52) U.S. Cl. .................... 716/4; 716/2; 716/18; 716/19
(58) Field of Classification Search ............. 716/2, 716/4, 18, 19
    See application file for complete search history.

(56) References Cited

U.S. PATENT DOCUMENTS

| 6,334,209 B1 | 12/2001 | Hashimoto et al. |
| 6,470,489 B1 | 10/2002 | Chang et al. |
| 6,748,571 B2 * | 6/2004 | Miwa .............................. 716/4 |
| 2004/0146788 A1 | 7/2004 | Nojima et al. |
| 2005/0153217 A1 | 7/2005 | Izuha et al. |

FOREIGN PATENT DOCUMENTS

JP 9-319067 12/1997

(Continued)

OTHER PUBLICATIONS

Newmark et al., "Large Area Optical Proximity Correction Using Pattern Based Corrections," SPIE, vol. 2322, pp. 374-386 (1994).

(Continued)

*Primary Examiner*—Thuan Do
(74) *Attorney, Agent, or Firm*—Finnegan, Henderson, Farabow, Garrett & Dunner, L.L.P.

(57) ABSTRACT

A semiconductor integrated circuit pattern verification method includes executing simulation to obtain a simulation pattern to be formed on a substrate on the basis of a semiconductor integrated circuit design pattern, comparing the simulation pattern and the design pattern that is required on the substrate to detect a first difference value, extracting error candidates at which the first difference value is not less than a first predetermined value, comparing pattern shapes at the error candidates to detect a second difference value, combining, into one group, patterns whose second difference values are not more than a second predetermined value, and extracting a predetermined number of patterns from each group and verifying error candidates of the extracted patterns.

14 Claims, 11 Drawing Sheets

FOREIGN PATENT DOCUMENTS

| | | |
|---|---|---|
| JP | 2003-107664 | 4/2003 |
| JP | 2004-184633 | 7/2004 |
| WO | WO-99/14638 | 3/1999 |

OTHER PUBLICATIONS

Izuha et al., "Pattern Verification Method, Pattern Verification System, Mask Manufacturing Method and Semiconductor Device Manufacturing Method," U.S. Appl. No. 11/012,494, filed Dec. 16, 2004.

Notice of Reasons for Rejection from the Japanese Patent Office, mailed Jul. 29, 2008, in Japanese Patent Application No. 2004-203439, and English translation thereof.

* cited by examiner

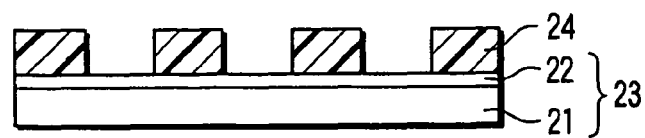
F I G. 14A
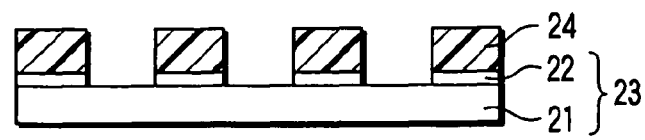
F I G. 14B
F I G. 14C
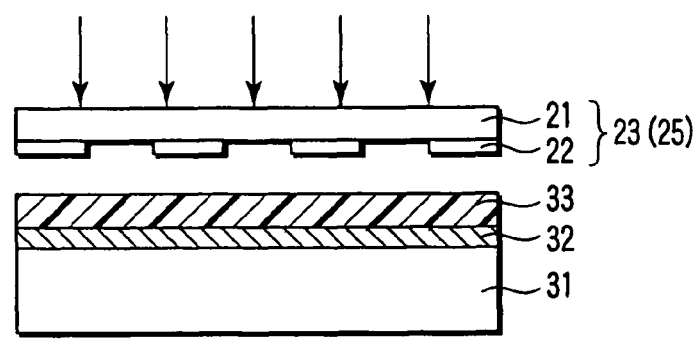
F I G. 15A
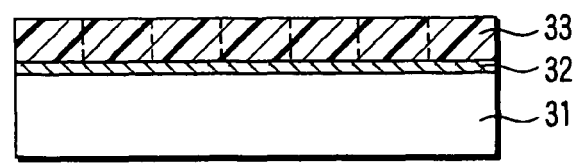
F I G. 15B

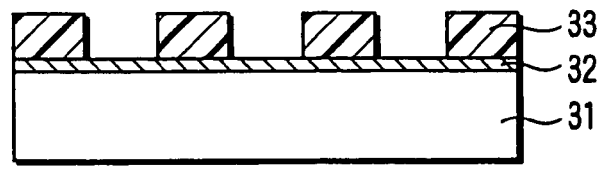
F I G. 15C
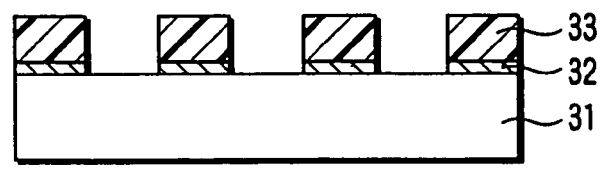
F I G. 15D
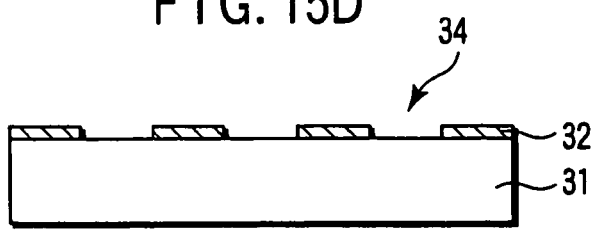
F I G. 15E
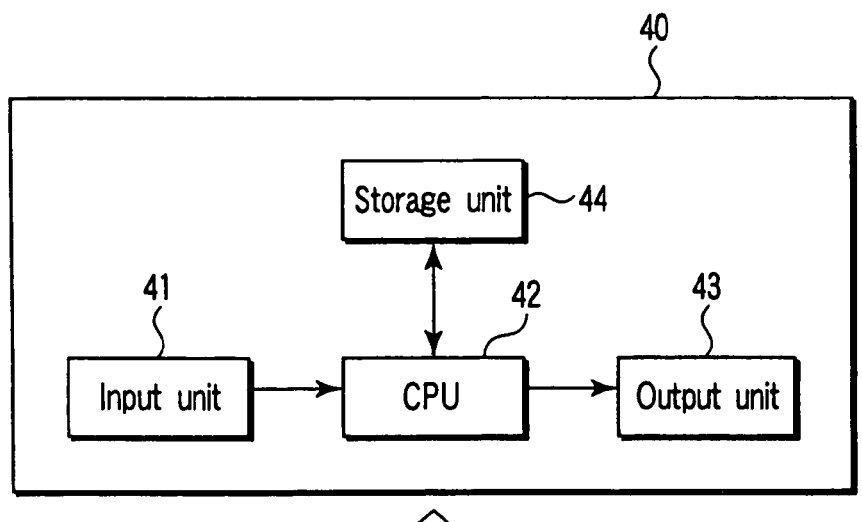
F I G. 16

SEMICONDUCTOR INTEGRATED CIRCUIT PATTERN VERIFICATION METHOD, PHOTOMASK MANUFACTURING METHOD, SEMICONDUCTOR INTEGRATED CIRCUIT DEVICE MANUFACTURING METHOD, AND PROGRAM FOR IMPLEMENTING SEMICONDUCTOR INTEGRATED CIRCUIT PATTERN VERIFICATION METHOD

CROSS-REFERENCE TO RELATED APPLICATIONS

This application is a divisional Application of application Ser. No. 11/176,181, filed Jul. 8, 2005, now U.S. Pat. No. 7,278,125 which is based upon and claims the benefit of priority from prior Japanese Patent Application No. 2004-203439, filed Jul. 9, 2004. The entire contents of these applications are incorporated herein by reference in their entirety.

BACKGROUND OF THE INVENTION

1. Field of the Invention

The present invention relates to a semiconductor integrated circuit pattern verification method capable of efficiently performing pattern verification, a photomask manufacturing method, a semiconductor integrated circuit device manufacturing method, and a program for implementing a semiconductor integrated circuit pattern verification method.

2. Description of the Related Art

Recent progress of the semiconductor manufacturing technique is very remarkable, and semiconductor elements micropatterned to a minimum feature size of 70 nm are mass-produced. Micropatterning is realized by rapid improvement of the pattern formation technique including mask process, photolithography, and etching.

When the pattern size of a semiconductor integrated circuit is large enough, the planar shape of a desired circuit pattern to be formed on a wafer is drawn as a design pattern as it is, and a mask pattern faithful to the design pattern is formed. The mask pattern is transferred onto a wafer through a projection optical system, and the substrate is etched to form almost the same pattern as the design pattern on the wafer.

However, as the patterns of semiconductor integrated circuits shrink in feature size, it becomes difficult to faithfully form a pattern by each process. The final dimension on a resultant wafer undesirably becomes different from the design pattern.

Especially in lithography and etching processes which are the most important in achieving micropatterning, the layout of patterns near a pattern to be formed greatly influences the dimensional accuracy of the pattern to be formed.

To cancel the influence of these processes, so-called OPC (Optical Proximity Correction) and PPC (Process Proximity Correction) have been developed. These techniques perform pattern correction in advance by adding a supplement pattern or increasing/decreasing the pattern width so as to adjust the dimension after processing to a desired design pattern. These techniques are reported in Jpn. Pat. Appln. KOKAI Publication Nos. 9-319067 and 2003-107664, and SPIE Vol. 2322 (1994) 374 (D. M. Newmark et al., Large Area Optical Proximity Correction using Pattern Based Correction).

These techniques can form on a wafer a semiconductor integrated circuit pattern drawn by the designer, but require verification of whether pattern correction by OPC and PPC has been performed correctly. In order to verify the accuracy of correction, verification may be done on the basis of the mask value. However, verification using a (lithography) simulator is indispensable for accurately executing verification.

For example, U.S. Pat. No. 6,470,489 discloses a verification tool which compares the edge of a desired pattern on a wafer with that of a pattern transferred using a layout after OPC, and checks whether the difference between these edges falls within a predetermined allowance.

Jpn. Pat. Appln. KOKAI Publication No. 9-319067 proposes a method of predicting at high precision a positional deviation between the edge of a desired pattern and that of a transferred pattern by using the same physical model for proximity correction and verification.

According to the prior arts, when patterns of the same type exist in one verification area, they are all detected. Thus, the number of detection portions is large, and it is very difficult to execute review (confirm portions at which patterns are detected).

BRIEF SUMMARY OF THE INVENTION

A semiconductor integrated circuit pattern verification method according to the first aspect of the present invention comprises executing simulation to obtain a simulation pattern to be formed on a substrate on the basis of a semiconductor integrated circuit design pattern, comparing the simulation pattern and the design pattern that is required on the substrate to detect a first difference value, extracting error candidates at which the first difference value is not less than a first predetermined value, comparing pattern shapes at the error candidates to detect a second difference value, combining, into one group, patterns whose second difference values are not more than a second predetermined value, and extracting a predetermined number of patterns from each group and verifying error candidates of the extracted patterns.

A program according to the second aspect of the present invention causes a computer to implement the semiconductor integrated circuit pattern verification method, the method comprises executing simulation to obtain a simulation pattern to be formed on a substrate on the basis of a semiconductor integrated circuit design pattern, comparing the simulation pattern and the design pattern that is required on the substrate to detect a first difference value, extracting error candidates at which the first difference value is not less than a first predetermined value, comparing pattern shapes at the error candidates to detect a second difference value, combining, into one group, patterns whose second difference values are not more than a second predetermined value, and extracting a predetermined number of patterns from each group and verifying error candidates of the extracted patterns.

BRIEF DESCRIPTION OF THE SEVERAL VIEWS OF THE DRAWING

FIGS. 14A to 14C are sectional views, respectively, showing steps in forming a mask according to the embodiment of the present invention;

FIGS. 15A to 15E are sectional views, respectively, showing steps in manufacturing a semiconductor integrated circuit device according to the embodiment of the present invention; and FIG. 16 is a block diagram showing a verification apparatus according to the embodiment of the present invention.

DETAILED DESCRIPTION OF THE INVENTION

Figure 1:
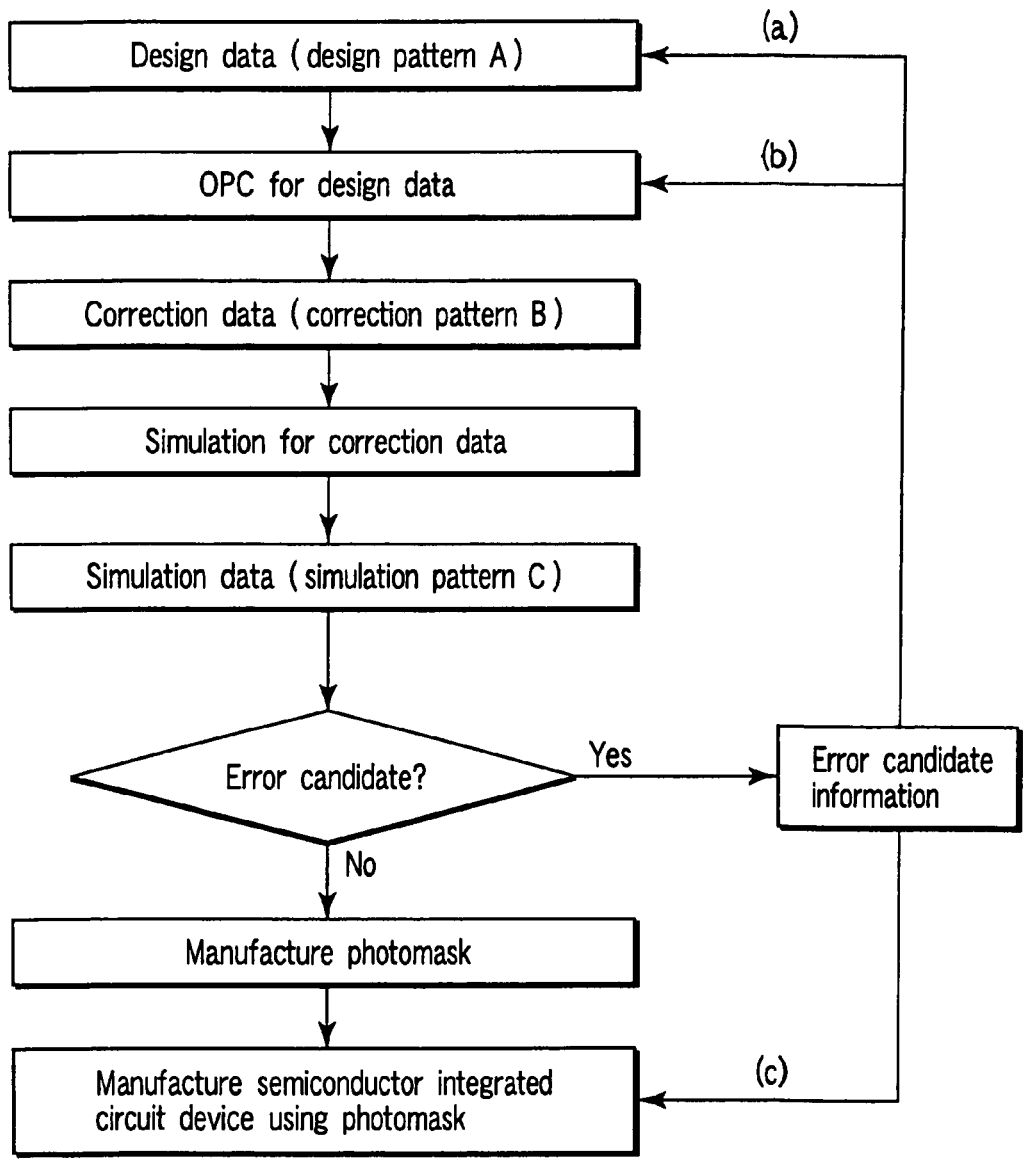
FIG. 1 is a flowchart showing a schematic flow from creation of design data to the manufacture of a semiconductor integrated circuit device according to an embodiment of the present invention.

An embodiment of the present invention will be described in detail below with reference to the several views of the accompanying drawing. In the following description, the same reference numerals denote the same parts throughout the drawing.

FIG. 1 is a flowchart showing a schematic flow from creation of design data to the manufacture of a semiconductor integrated circuit device according to the embodiment of the present invention. A flow of forming an exposure photomask after pattern verification and manufacturing a semiconductor integrated circuit device by using the photomask will be explained.

Design data (design pattern A) of a semiconductor integrated circuit is created by the designer. The design data undergoes OPC (Optical Proximity Correction) to create correction data (correction pattern B).

Simulation is done for the correction data to create simulation data (simulation pattern C). The simulation pattern C and design pattern A are compared to perform pattern verification of whether a portion (error candidate) exists at which the difference between the simulation pattern C and the design pattern A is equal to or larger than a predetermined value.

If it is determined as a result of pattern verification that no error candidate exists, a photomask is formed without using any error candidate information, and a semiconductor integrated circuit device is manufactured using the photomask.

If an error candidate is determined to exist, error candidate information is utilized. (a) Correction of design data, (b) change of an OPC parameter, and (c) setting of a management point on a wafer (point referred to for setting conditions in manufacturing a semiconductor integrated circuit device) are performed for a portion from which the error candidate is extracted.

In the above flow, programs for implementing (1) semiconductor integrated circuit pattern verification method, (2) photomask manufacturing method, (3) semiconductor integrated circuit device manufacturing method, and (4) semiconductor integrated circuit pattern verification method will be described in detail.

(1) Semiconductor Integrated Circuit Pattern Verification Method

Figure 2:
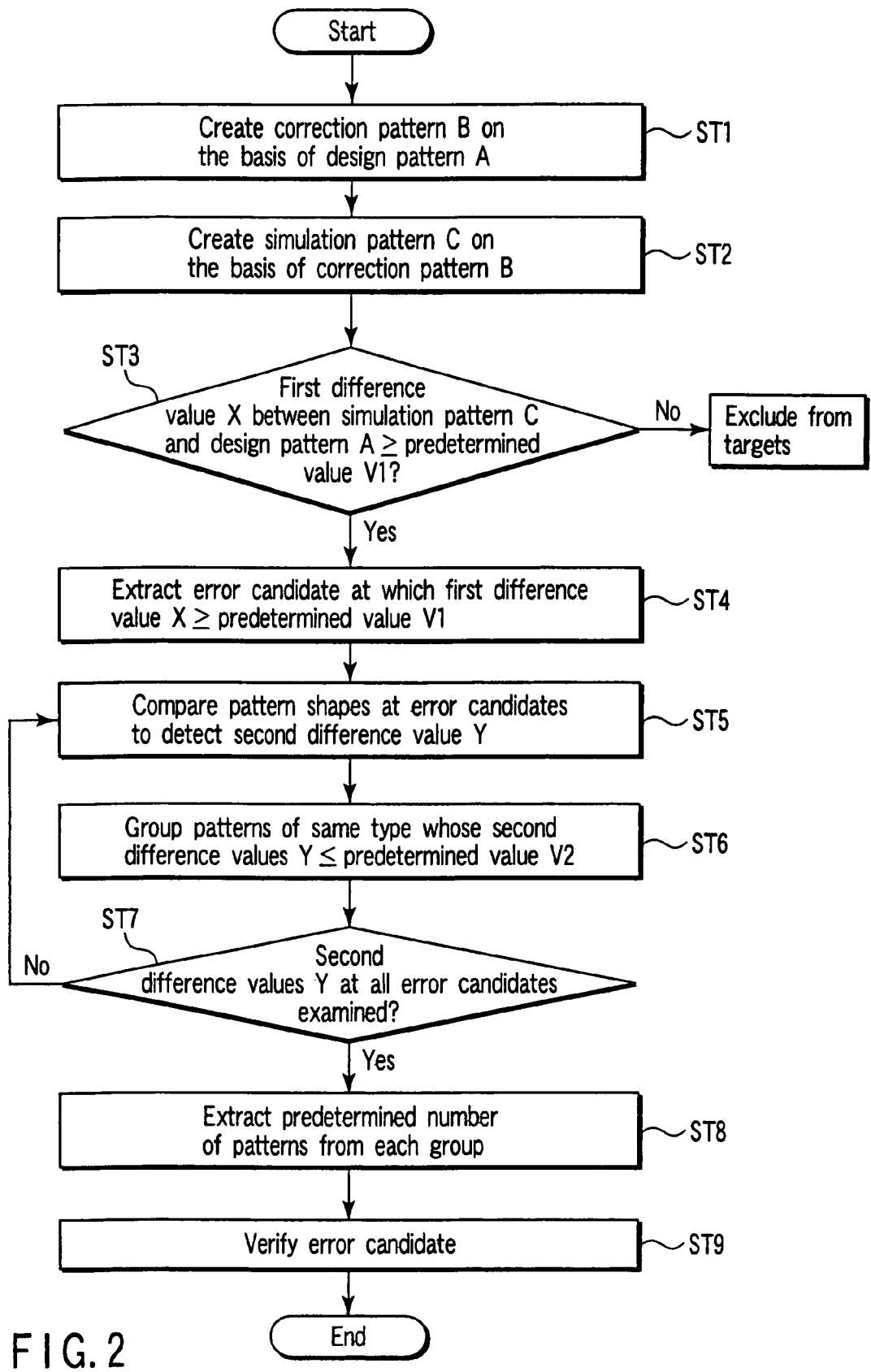
FIG. 2 is a flowchart showing the flow of a semiconductor integrated circuit pattern verification method according to the embodiment of the present invention.
Figure 3:
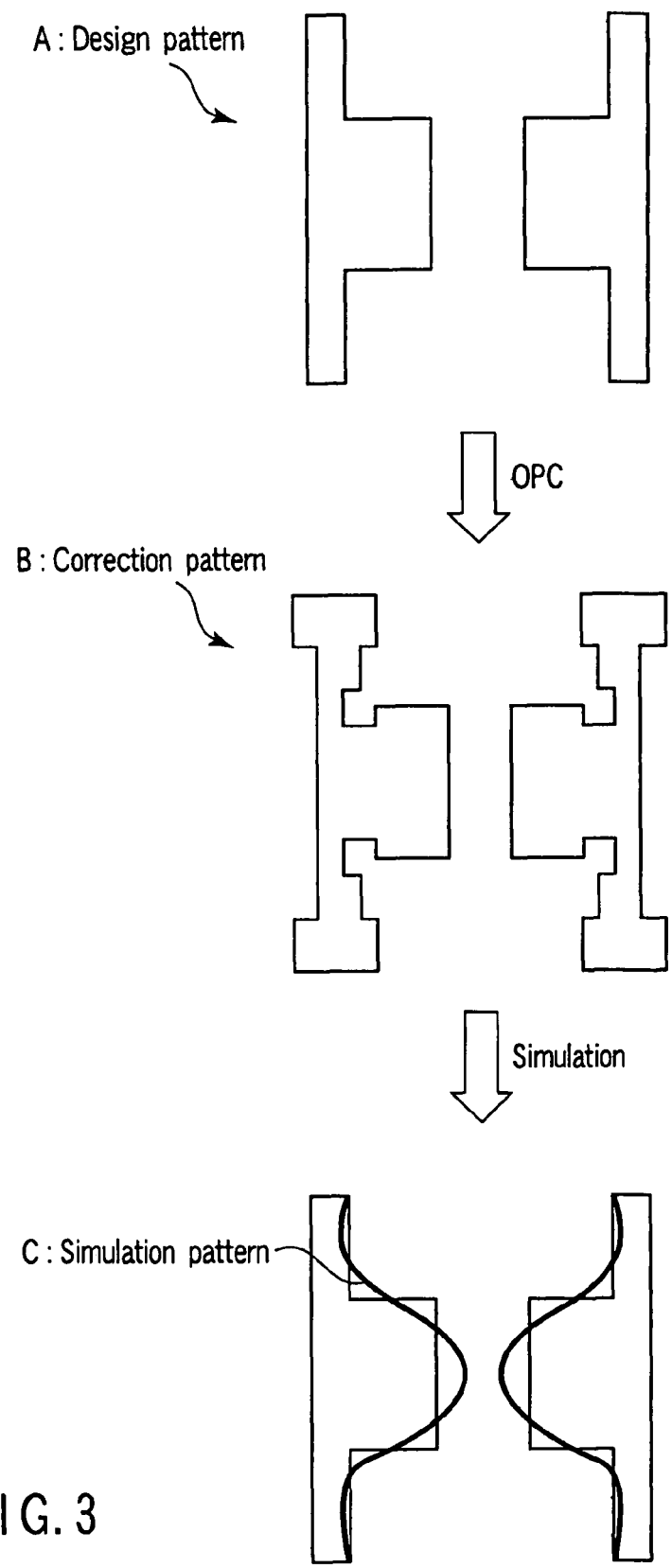
FIG. 3 is a view showing a design pattern A, correction pattern B, and simulation pattern C in ST1 and ST2 of FIG. 2.
Figure 9:
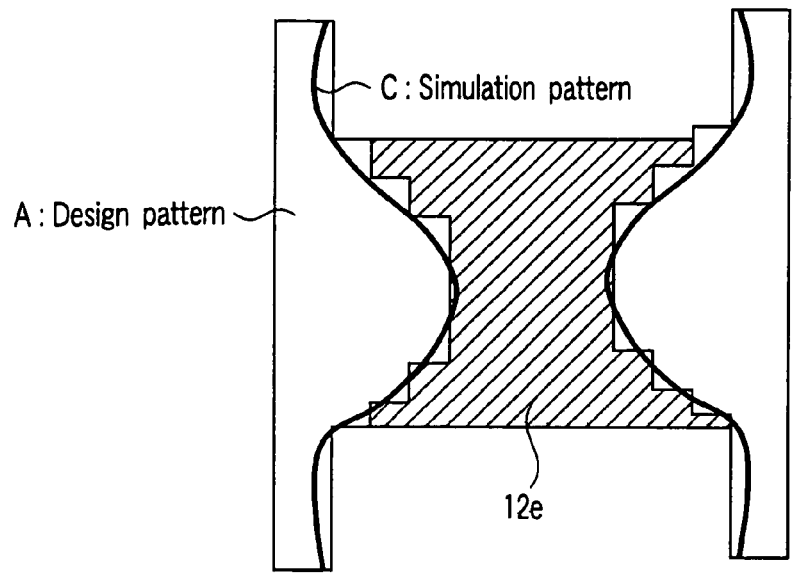
Figure 10:
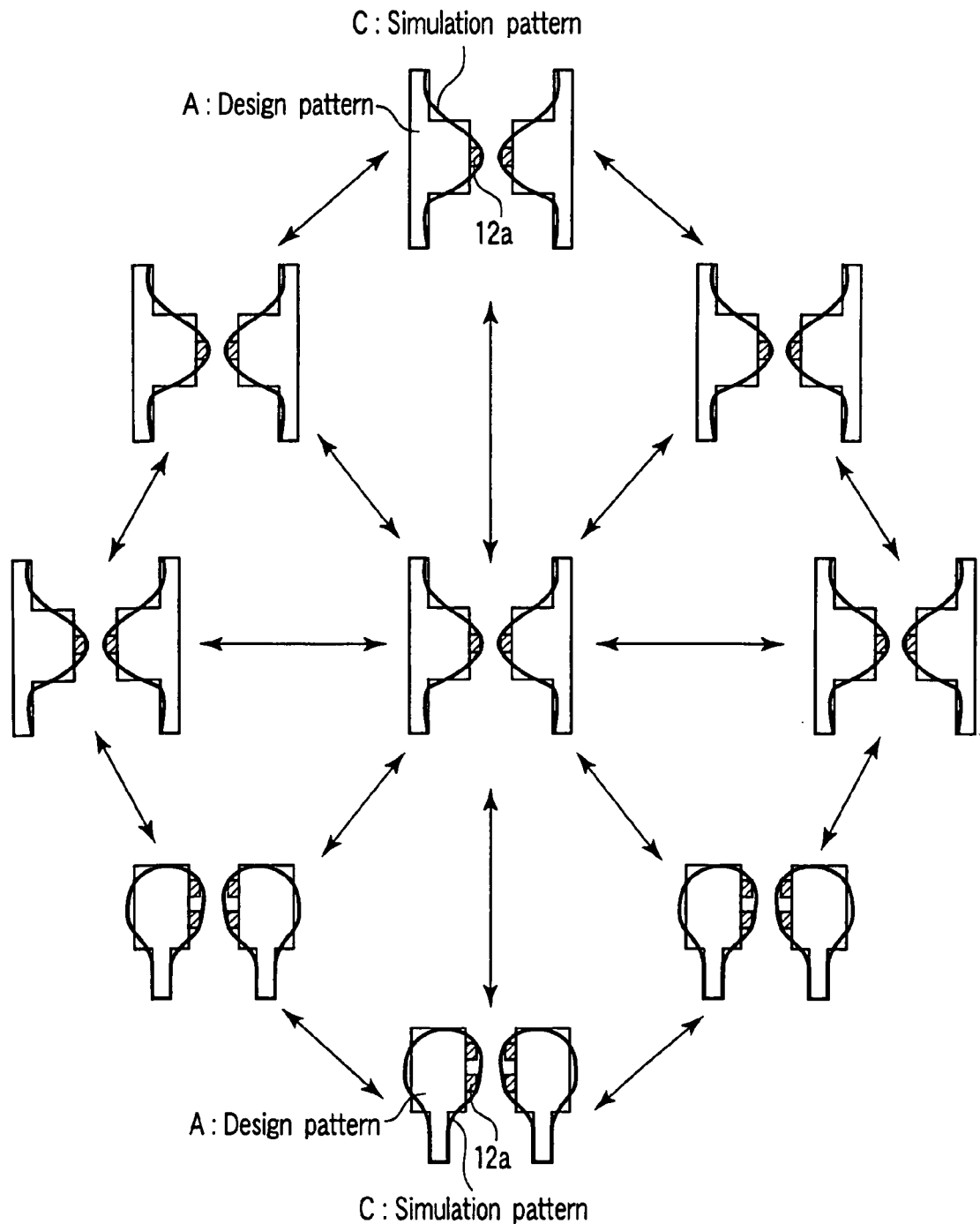
FIG. 10 is a view showing method 1) of detecting the second difference value Y in ST5 of FIG. 2.
Figure 11:
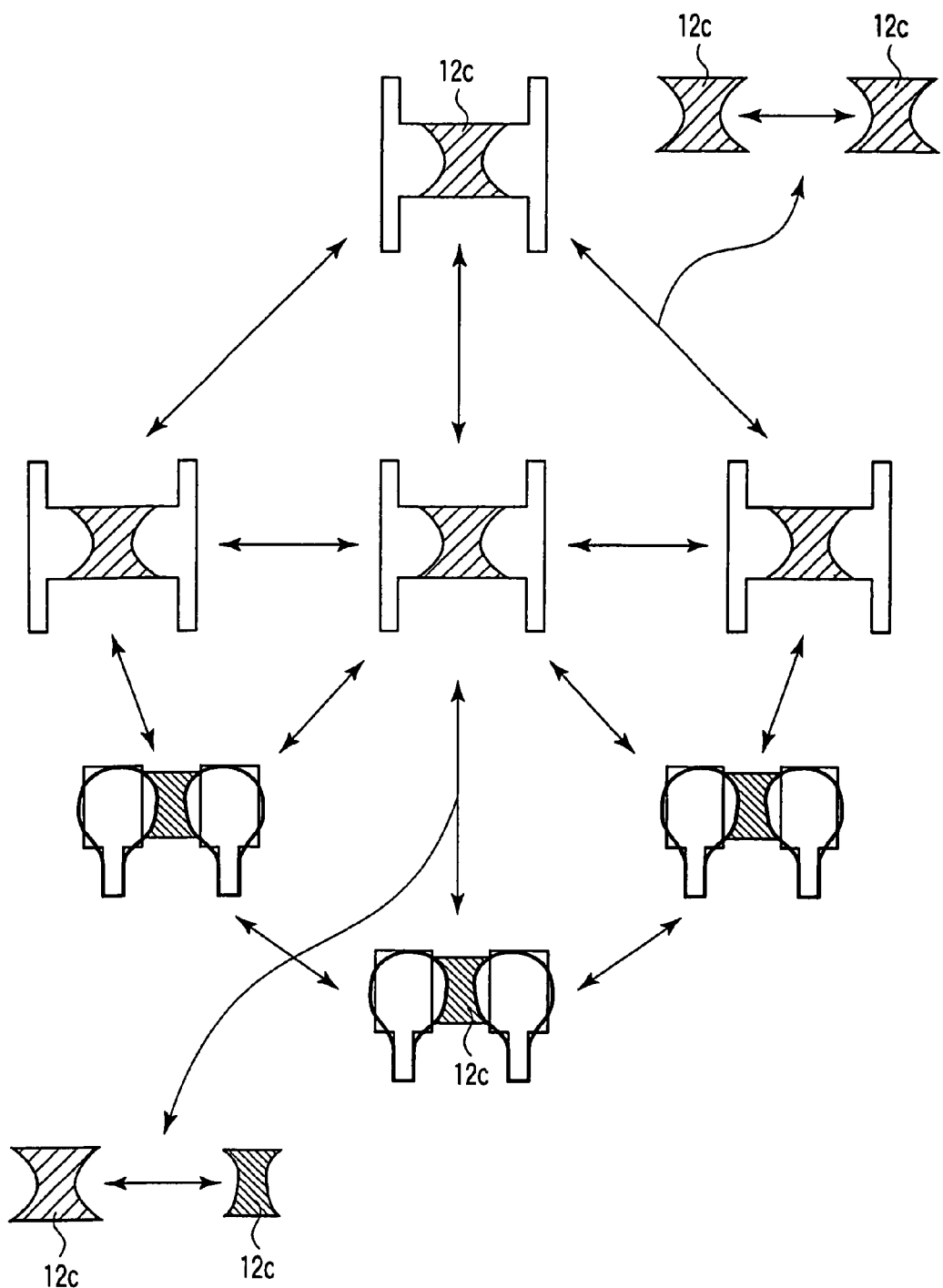
FIG. 11 is a view showing method 2) of detecting the second difference value Y in ST5 of FIG. 2.
Figure 12:
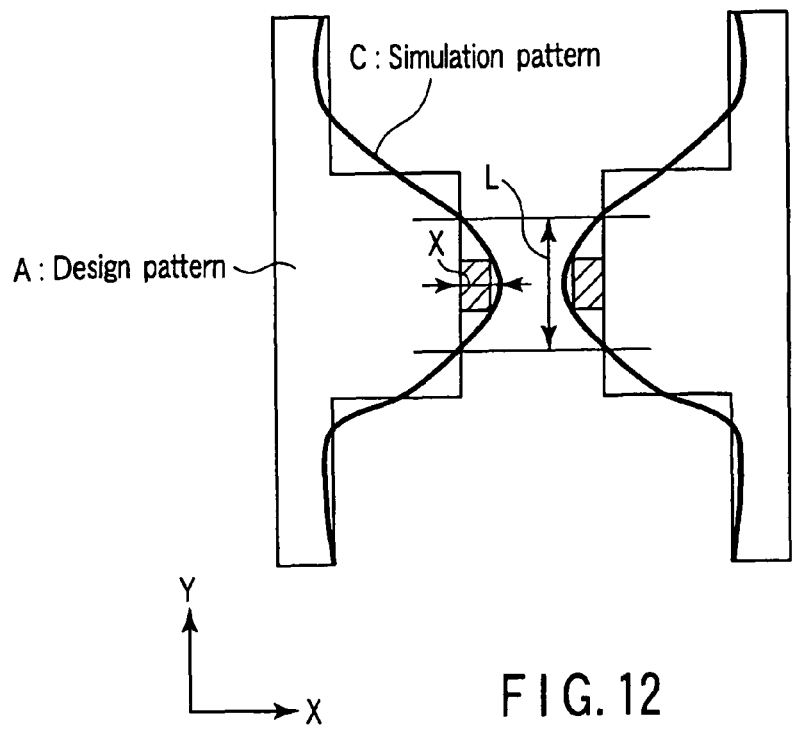
FIGS. 12 and 13 are views showing other conditions for extracting an error candidate in ST3 and ST4 of FIG. 2.
Figure 13:
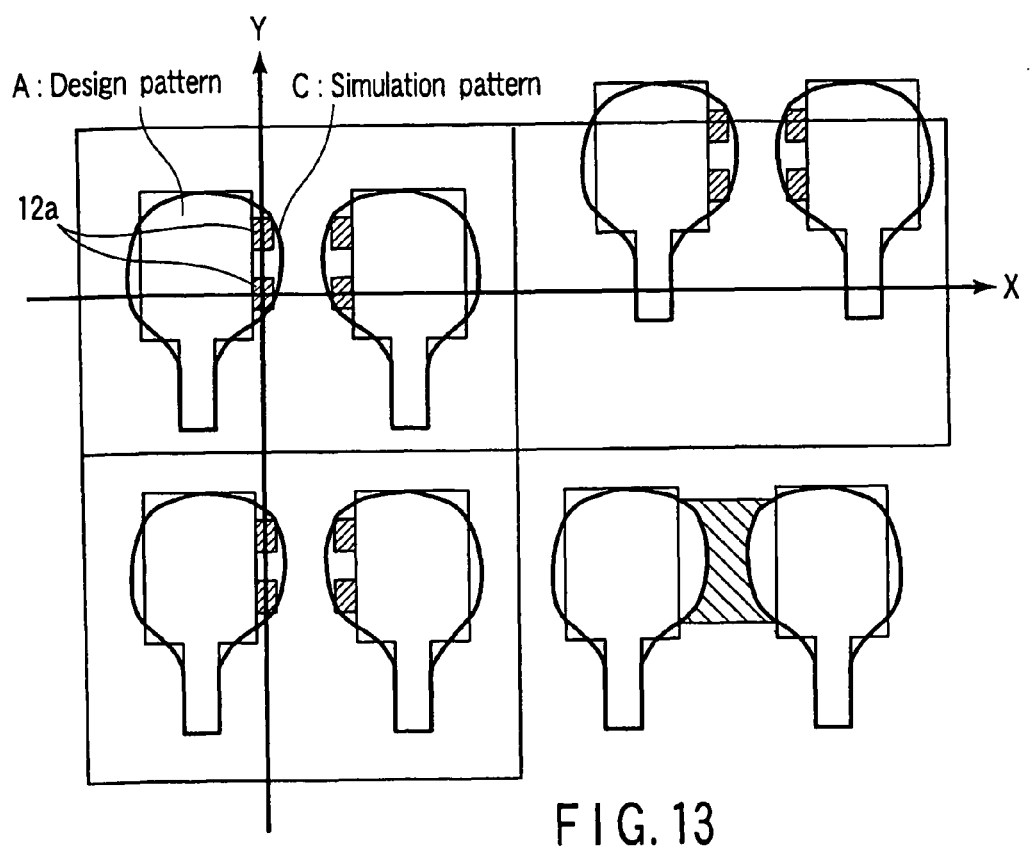

FIG. 2 is a flowchart showing the flow of a semiconductor integrated circuit pattern verification method according to the embodiment of the present invention. FIG. 3 shows a design pattern A, correction pattern B, and simulation pattern C in ST1 and ST2 of FIG. 2. FIGS. 4 to 9 show methods A) to D) of detecting the first difference value X in ST3 of FIG. 2. FIGS. 10 and 11 show methods 1) and 2) of detecting the second difference value Y in ST5 of FIG. 2. FIGS. 12 and 13 show other conditions for extracting an error candidate in ST3 and ST4 of FIG. 2. The flow of the semiconductor integrated circuit pattern verification method will be explained step (ST) by step.

[ST1]

In ST1, a correction pattern B is formed on the basis of a desired design pattern A. ST1 will be explained in detail.

The designer creates design data of a semiconductor integrated circuit having a desired pattern shape (design pattern A) on a processing substrate (see FIG. 3). The design data undergoes deformation processing by OPC in consideration of the optical proximity effect of an exposure device and the influence on the processing substrate. By performing OPC for the design pattern A, a correction pattern B is formed (see FIG. 3).

[ST2]

In ST2, simulation is done for correction data of the correction pattern B to form a simulation pattern C serving as a pattern evaluation target. ST2 will be explained in detail.

Simulation is done for correction data of the correction pattern B in consideration of the optical proximity effect of the exposure device and the influence on the processing substrate, similar to ST1. As a result, a simulation pattern C is formed on the processing substrate (see FIG. 3).

The simulation pattern C may also be formed by executing, for design data, simulation for correction processing which considers the optical proximity effect of the exposure device and the influence on the processing substrate, without executing any OPC for the design data, unlike ST1.

[ST3]

In ST3, the simulation pattern C and design pattern A are compared, and it is examined whether the first difference value X obtained by the comparison is equal to or larger than a predetermined value V1. In ST3, a portion of high risk is detected at which the deviation between the simulation pattern C and the design pattern A is large. ST3 will be explained in detail.

The simulation pattern C and design pattern A are compared to detect the first difference value X. Conceivable examples of the detection method are the following four methods A) to D). Of the four methods, method D) whose calculation time is the shortest is desirable.

A) Method Using Edge of Simulation Pattern C as Reference

Figure 4:
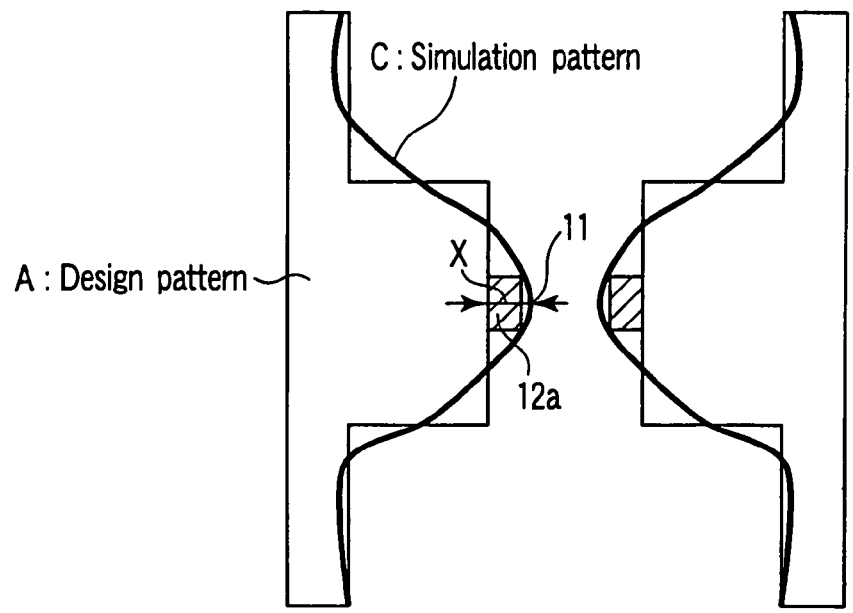
FIG. 4 is a view showing method A) of detecting the first difference value X in ST3 of FIG. 2.

B) Method Using CD (Critical Dimension) Between Simulation Patterns C as Reference C) Method Using Shape which Buries Gap Between Simulation Patterns C as Reference D) Method Using Division Evaluation Point of Simulation Pattern C as Reference According to method A), as shown in FIG. 4, a mark 12a is added between an edge 11 of the simulation pattern C and the design pattern A. Using the edge 11 of the simulation pattern C as a reference, the first difference value X is detected from the distance between the edge 11 and the design pattern A.

Figure 5:
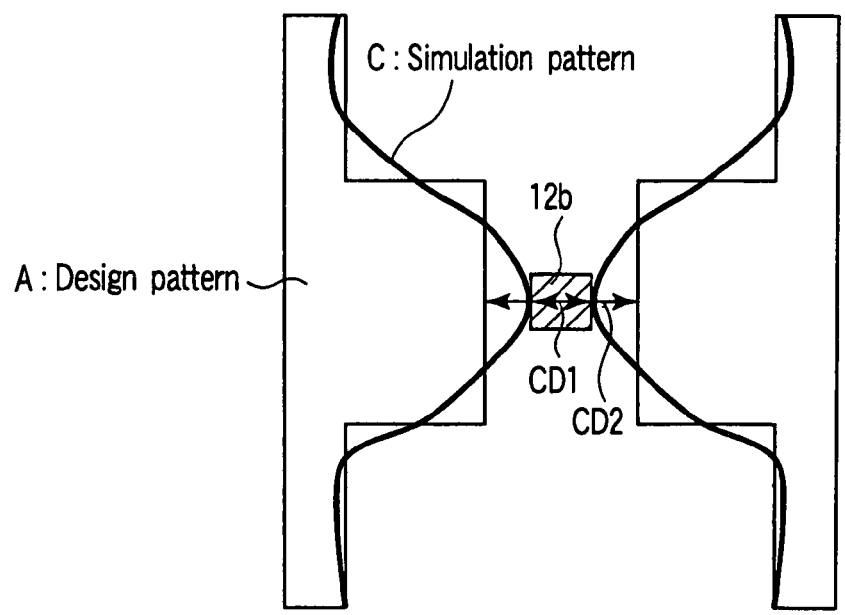
FIG. 5 is a view showing method B) of detecting the first difference value X in ST3 of FIG. 2.

According to method B), as shown in FIG. 5, a mark 12b is added at a portion at which the distance between adjacent simulation patterns C becomes shortest. A shortest distance CD1 between adjacent simulation patterns C is derived, and a shortest distance CD2 between adjacent design patterns A that corresponds to the portion of the shortest distance CD1 is derived. The shortest distances CD1 and CD2 are compared to detect the first difference value X. The first difference value X can also be detected by comparing the shortest distance CD1 not with the shortest distance CD2 but with a predetermined reference value.

Figure 6:
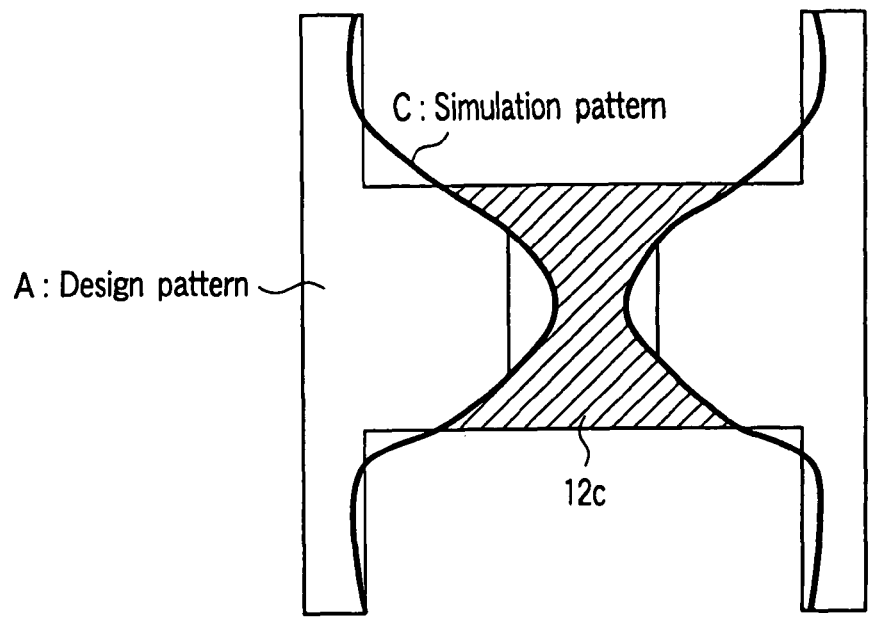
FIGS. 6 and 7 are views showing method C) of detecting the first difference value X in ST3 of FIG. 2.
Figure 7:
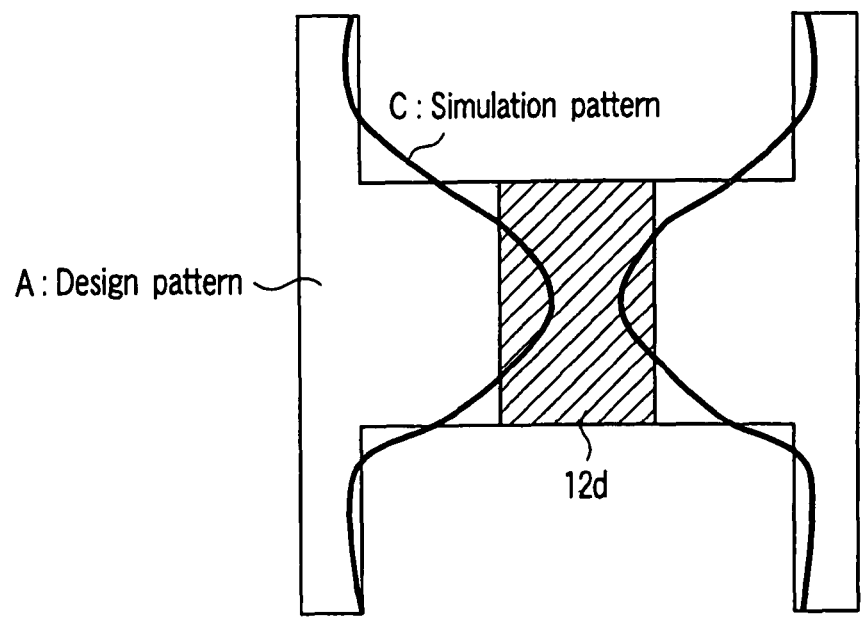

According to method C), as shown in FIG. 6, a mark 12c is formed in contact with adjacent simulation patterns C so as to bury the gap between them. Similarly, as shown in FIG. 7, a mark 12d is formed in contact with adjacent design patterns A so as to bury the gap between them. The shapes of the marks 12c and 12d are compared to detect the first difference value X. The first difference value X can also be detected by comparing the mark 12c not with the mark 12d but with a predetermined reference value.

Figure 8:
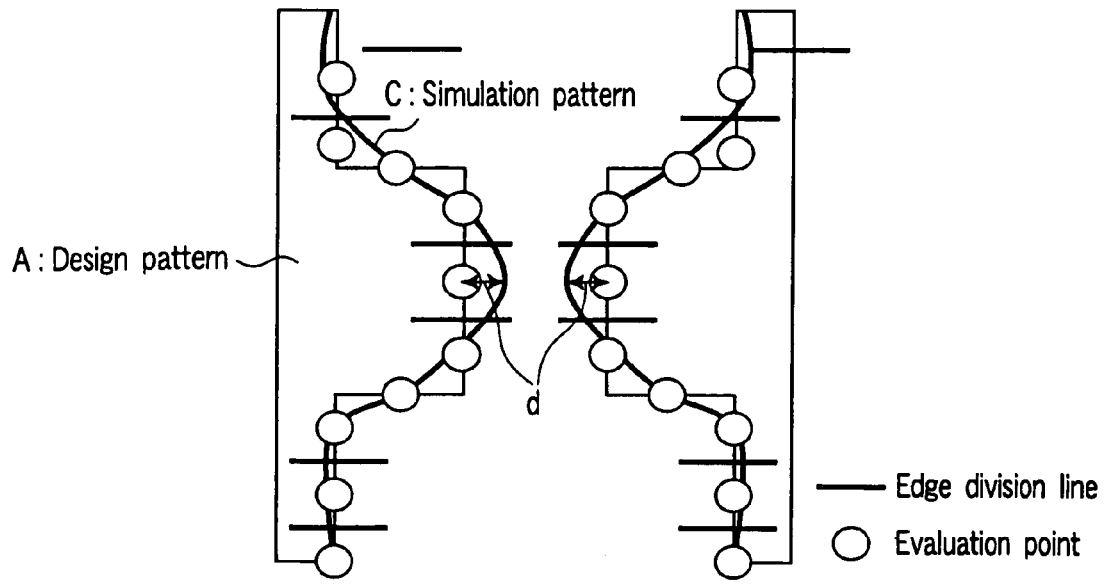
FIGS. 8 and 9 are views showing method D) of detecting the first difference value X in ST3 of FIG. 2.

According to method D), as shown in FIG. 8, the edge of the design pattern A is divided at a predetermined interval (e.g., each grid), and at least one evaluation point is set at each divided edge. A difference value d between an evaluation point set at each edge and a portion of the simulation pattern C that corresponds to the evaluation point is obtained by simulation. The plane of each divided edge is moved at each grid by the difference value d onto the simulation pattern C. As shown in FIG. 9, a mark 12e is formed by digitizing the shape of the simulation pattern C. The shape of the mark 12e and that of the mark 12d of the design pattern A shown in FIG. 7 are compared to detect the first difference value X. The first difference value X can also be detected by comparing the mark 12e not with the mark 12d but with a predetermined reference value.

It is determined whether the first difference value X detected by a method such as one of the above-mentioned methods A) to D) is equal to or larger than the predetermined value V1. If the first difference value X is equal to or larger than the predetermined value V1, the difference is large, and the pattern is subjected to pattern verification. If the first difference value X is smaller than the predetermined value V1, the difference is small, and the pattern is not subjected to pattern verification.

The predetermined value V1 is, for example, (a) 10% of the minimum dimension of a design rule permissible by the semiconductor integrated circuit pattern, or (b) about 20% of the dimension (width, length, space, area, or the like) at a comparison portion. For (a), when the minimum dimension of the design rule is, e.g., 100 nm, the predetermined value V1 is 10 nm. For (b), when the dimension at a comparison portion is, e.g., 200 nm, the predetermined value V1 is 160 to 240 nm.

[ST4]

In ST4, portions (error candidates) containing locations at which the first difference value X is equal to or larger than the predetermined value V1 are extracted. That is, the design pattern A, simulation pattern C, marks 12a to 12e, and the like containing portions of high risk at which the first difference value X is large are extracted.

[ST5]

In ST5, patterns at the error candidates extracted in ST4 are compared to detect the second difference value Y. Conceivable examples of the detection method are the following methods 1) and 2).

1) Method of Comparing Shapes of Patterns A and C
2) Method of Comparing Shapes of Marks Method 1) can be employed in methods A) to D) in ST3. FIG. 10 shows an example when method 1) is applied to A) in ST3. The second difference value Y is detected by comparing the pattern shapes of design patterns A at error candidates with each other, or comparing those of simulation patterns C at error candidates with each other.

Method 2) is effective for C) and D) in ST3. FIG. 11 shows an example when method 1) is applied to C) in ST3. The second difference value Y is detected by comparing the shapes of marks 12c at error candidates with each other.

In mark shape comparison 2), it is also possible to output a mark shape as polygon data, obtain the vertex coordinates of the polygon data, and use the relative positional relationship between the vertex coordinates as a reference. In this case, marks having the same shapes are equal in the number of vertexes of the polygon, and also equal in the length of each side which forms the mark shape. For example, when marks have the same number of vertexes, the sum of the absolute values of differences in length along respective sides is 0 or more, and the difference in length along each side is equal to or smaller than a predetermined value (e.g., 1%), the marks are determined to be identical (no second difference value Y). In this manner, fuzzy comparison of the mark shape is also possible.

[ST6]

In ST6, patterns of the same type whose second difference values Y detected by a method such as the above-mentioned method 1) or 2) are equal to or smaller than a predetermined value V2 are combined into one group. In other words, patterns whose pattern deviates at error candidates are equal are combined into one group.

The "predetermined value V2 or less" means, e.g., (a) a deviation below 10% of the minimum dimension of a design rule permissible by the semiconductor integrated circuit pattern, (b) a deviation below 20% of the dimension (width, length, area, or the like) at an error candidate, or (c) the minimum unit (minimum increment unit, e.g., about 1 nm or 5 nm) used in the design.

The predetermined value V2 is set so that patterns can be grouped even when pattern shapes at error candidates perfectly coincide with each other and do not have any second difference value Y.

[ST7]

In ST7, it is confirmed whether second difference values Y at all error candidates have been examined in ST5. If all the second difference values Y have been examined, the flow advances to ST8; if all the second difference values Y have not been examined, the flow returns to ST5 to examine the second difference value Y again.

[ST8]

In ST8, a predetermined number of (e.g., one) patterns are extracted from each group defined in ST6.

[ST9]

In ST9, error candidates on the pattern extracted in ST8 are verified. After verification, error candidate information is exploited to perform, for portions from which error candidates are extracted, (a) correction of design data, (b) change of an OPC parameter, and (c) setting of a management point on a wafer (point referred to for setting conditions in manufacturing a semiconductor integrated circuit device), as shown in FIG. 1.

The semiconductor integrated circuit pattern verification method is not limited to the above method, and can be variously changed as follows.

In ST3, as the method of detecting the first difference value X, it is also possible to output the pattern shapes of the design pattern A, simulation pattern C, marks 12a to 12e, and the like as polygon data, obtain the vertex coordinates of the polygon data, and compare the pattern shapes on the basis of the relative positional relationship between the vertex coordinates.

After error candidates are extracted in ST4, error candidates of higher risk are further extracted from patterns at the extracted error candidates by using the following first to third methods. This process can increase the efficiency of subsequent steps.

According to the first method, as shown in FIG. 12, a Y-axis length L is adopted as a comparison reference in addition to an X-axis length X. At a portion at which the simulation pattern C deviates from the design pattern A by the length X along the X-axis, the risk of the pattern deviation is higher for a larger length L of a deviation at this portion along the Y-axis perpendicular to the X-axis. From this, whether the length L is equal to or larger than a predetermined value (e.g., 10% of the minimum dimension of the design rule) is added to conditions. When the length L is smaller than the predetermined value, the risk is low, and that portion is not subjected to verification. When the length L is equal to or larger than the predetermined value, the risk is high, and that portion is subjected to verification. Pattern shapes having the same length at error candidates are compared with each other in ST5 by using the length L, thereby increasing the grouping efficiency of patterns of the same type in ST6.

According to the second method, as shown in FIG. 11, the coordinates of the mark 12a are adopted as a comparison reference. This method gives attention to marks at error candidates extracted in ST4. The coordinates of an arbitrary one of the marks are selected, and a predetermined number of marks positioned on the same X- or Y-axis as that of the selected coordinates are extracted. Since identical shapes are often laid out on the same coordinate axis, pattern shapes at error candidates on the same coordinate axis are compared with each other in ST5. As a result, the grouping efficiency of patterns of the same type in ST6 can be increased. Patterns on coordinate axes deviated by a predetermined value (e.g., 3%) from the X- and Y-axes of selected coordinates may be extracted as verification targets, in addition to extracting patterns on the same coordinate axis as either the X- or Y-axis of the selected coordinates.

According to the third method, a situation around an error candidate extracted in ST4 is adopted as a reference. When only one error candidate exists in a preset range (10% of the minimum dimension of the design rule), the risk is low, and the error candidate is not subjected to verification. When a plurality of error candidates exist, the risk is high, and the error candidates are subjected to verification. Hence, only error candidates of higher risk can be extracted.

(2) Photomask Manufacturing Method

FIGS. 14A to 14C are sectional views, respectively, showing steps in the photomask manufacturing method according to the embodiment of the present invention. The method of forming a photomask will be explained. The circuit pattern of a semiconductor circuit design used undergoes pattern verification on the basis of (1) semiconductor integrated circuit pattern verification method. When an error candidate exists, design data is corrected at a portion from which the error candidate is extracted.

As shown in FIG. 14A, a mask substrate 23 prepared by forming a light-shielding film 22 on a glass substrate 21 is used, and a photoresist 24 is applied onto the mask substrate 23. The photoresist 24 is exposed and developed on the basis of design data, and patterned into the design pattern A. As shown in FIG. 14B, the light-shielding film 22 is selectively etched by RIE (Reactive Ion Etching) or the like using the patterned photoresist 24 as a mask. After that, as shown in FIG. 14C, the photoresist 24 is removed. In this fashion, an exposure photomask 25 having the shape of the desired design pattern A is formed.

(3) Semiconductor Integrated Circuit Device Manufacturing Method

FIGS. 15A to 15E are sectional views, respectively, showing steps in the semiconductor integrated circuit device manufacturing method according to the embodiment of the present invention. The method of manufacturing a semiconductor integrated circuit device by using a photomask formed by (2) photomask manufacturing method will be explained.

As shown in FIG. 15A, a material layer 32 is formed on a semiconductor substrate 31, and a photoresist 33 is applied onto the material layer 32. The photoresist 33 is selectively irradiated with ultraviolet rays by using the above-described photomask 25. As a result, as shown in 15B, a design pattern A is formed as a latent image by photochemical reaction in the photoresist 33. The design pattern A is developed, visualized as an image, and printed on the photoresist 33, as shown in FIG. 15C. After the material layer 32 is patterned using the patterned photoresist 33, as shown in FIG. 15D, the photoresist 33 is removed, as shown in FIG. 15E. Consequently, a semiconductor integrated circuit device 34 having the shape of the desired design pattern A is formed.

(4) Program for Implementing Semiconductor Integrated Circuit Pattern Verification Method FIG. 16 is a block diagram showing a verification apparatus according to the embodiment of the present invention. A program which causes a computer to implement (1) semiconductor integrated circuit pattern verification method will be explained.

As shown in FIG. 16, a verification apparatus 40 comprises an input unit 41, CPU (control unit) 42, output unit 43, and storage unit 44. The verification apparatus 40 can be implemented by a computer which loads a program recorded on a recording medium 45 and controls the operation by the program. The recording medium 45 records a computer-readable program for causing a computer to implement (1) semiconductor integrated circuit pattern verification method.

The computer which implements (1) semiconductor integrated circuit pattern verification method loads the program recorded on the recording medium 45. The operation of the computer is controlled by the program, thus implementing processes of (1) semiconductor integrated circuit pattern verification method.

Examples of the recording medium 45 are a magnetic disk (floppy disk®, hard disk, or the like), an optical disk (CD-ROM, DVD, or the like), and a semiconductor memory.

The program can be applied to the verification apparatus 40 by writing the program into the recording medium 45, and can also be applied to various apparatuses. For example, the program can also be applied to various apparatuses by transmitting the program via a communication medium.

The program recorded on the recording medium 45 need not always be recorded on the recording medium 45, and may be recorded in, e.g., the verification apparatus 40.

The following effects can be obtained by the semiconductor integrated circuit pattern verification method, the photomask manufacturing method, the semiconductor integrated circuit device manufacturing method, and the program for implementing the semiconductor integrated circuit pattern verification method according to the embodiment of the present invention.

A semiconductor integrated circuit pattern is often formed from patterns of the same shape. Patterns of the same shape provide the same simulation result of pattern verification, but all patterns of the same type which exist in one verification area are conventionally verified. To the contrary, according to the embodiment, patterns of the same type whose second difference values Y are equal to or smaller than the predetermined value V2 are grouped (ST6). For example, one verification portion is extracted from a group of patterns of the same type, decreasing the number of detection portions. Verification at the detection portions can be efficiently performed.

In the prior art, the positional deviation of an edge from a large pattern and that of an edge from a small pattern are equally treated. To the contrary, according to the embodiment, when the first difference value X between the simulation pattern C and the design pattern A is equal to or smaller than the predetermined value V1, i.e., the risk is low, that portion is not subjected to verification (ST3). Error candidates can be efficiently extracted in pattern verification, and only portions of high risk can undergo pattern verification.

By using error candidate information extracted by verification of error candidates, (a) correction of design data, (b) change of an OPC parameter, and (c) setting of a management point on a wafer (point referred to for setting conditions in manufacturing a semiconductor integrated circuit device) are performed for a portion from which an error candidate is extracted. Thus, a feedback destination corresponding to error candidate information can be properly selected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit pattern verification method comprising:
    comparing shapes of simulation patterns, the simulation patterns being calculated by executing simulation on the basis of design patterns;
    based on results of the comparing, combining, into one group, a subset of the simulation patterns such that values of differences among shapes of simulation patterns in the one group are not more than a predetermined value; and
    verifying information of extracted simulation patterns extracted from the one group.

2. The method according to claim 1, wherein a number of the extracted simulation patterns extracted from the one group to be verified is less than a total number of the simulation patterns belonging to the one group.

3. The method according to claim 1, wherein the predetermined value includes 10% of a minimum dimension of a design rule, 20% of a dimension at a comparison portion, and a minimum unit used in design.

4. The method according to claim 1, wherein the information of the extracted simulation patterns verifies to correct the design patterns.

5. The method according to claim 1, wherein the one group includes simulation patterns whose difference values are more than the predetermined value.

6. The method according to claim 1, wherein the extracted simulation patterns are extracted based on a comparison between the simulation patterns and the design patterns.

7. The method according to claim 6, wherein simulation patterns with error candidates are extracted as a result of the comparison between the simulation patterns and the design patterns.

8. A non-transitory computer readable medium encoded with a computer program for implementing a semiconductor integrated circuit pattern verification method, the computer program comprising instructions for:
    comparing shapes of simulation patterns, the simulation patterns being calculated by executing simulation on the basis of design patterns;
    based on results of the comparing, combining, into one group, a subset of the simulation patterns such that values of differences among shapes of simulation patterns in the one group are not more than a predetermined value; and
    verifying information of extracted simulation patterns extracted from the one group.

9. The non-transitory computer readable medium according to claim 8, wherein a number of the extracted simulation patterns extracted from the one group to be verified is less than a total number of the simulation patterns belonging to the one group.

10. The non-transitory computer readable medium according to claim 8, wherein the predetermined value includes 10% of a minimum dimension of a design rule, 20% of a dimension at a comparison portion, and a minimum unit used in design.

11. The non-transitory computer readable medium according to claim 8, wherein the information of the extracted simulation patterns verifies to correct the design patterns.

12. The non-transitory computer readable medium according to claim 8, wherein the one group includes simulation patterns whose difference values are more than the predetermined value.

13. The non-transitory computer readable medium according to claim 8, wherein the extracted simulation patterns are extracted based on a comparison between the simulation patterns and the design patterns.

14. The non-transitory computer readable medium according to claim 13, wherein simulation patterns with error candidates are extracted as a result of the comparison between the simulation patterns and the design patterns.

* * * * *